(12) United States Patent
Chuang et al.

(10) Patent No.: US 11,502,126 B2
(45) Date of Patent: Nov. 15, 2022

(54) INTEGRATED CIRCUIT AND FABRICATION METHOD THEREOF

(71) Applicant: TAIWAN SEMICONDUCTOR MANUFACTURING CO., LTD., Hsinchu (TW)

(72) Inventors: Harry-Hak-Lay Chuang, Hsinchu County (TW); Sheng-Wen Fu, Hsinchu (TW); Jun-Yao Chen, Taoyuan (TW); Sheng-Huang Huang, Hsinchu (TW); Hung-Cho Wang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 85 days.

(21) Appl. No.: 17/097,485

(22) Filed: Nov. 13, 2020

(65) Prior Publication Data
US 2022/0157886 A1    May 19, 2022

(51) Int. Cl.
*H01L 27/22* (2006.01)
*H01L 21/768* (2006.01)
*H01L 43/12* (2006.01)

(52) U.S. Cl.
CPC ...... *H01L 27/228* (2013.01); *H01L 21/76802* (2013.01); *H01L 21/76832* (2013.01); *H01L 21/76834* (2013.01); *H01L 21/7684* (2013.01); *H01L 21/76819* (2013.01); *H01L 21/76843* (2013.01); *H01L 21/76877* (2013.01); *H01L 43/12* (2013.01)

(58) Field of Classification Search
CPC ............. H01L 27/228; H01L 21/76802; H01L 21/76832; H01L 21/76834; H01L 21/76819; H01L 21/7684; H01L 21/76843; H01L 21/76877; H01L 43/12
See application file for complete search history.

(56) References Cited

U.S. PATENT DOCUMENTS

2021/0375986 A1*   12/2021   Dutta .................... H01L 27/222

* cited by examiner

*Primary Examiner* — Karen Kusumakar
(74) *Attorney, Agent, or Firm* — Birch, Stewart, Kolasch & Birch, LLP

(57) ABSTRACT

A method for fabricating an integrated circuit is provided. The method includes depositing an etch stop layer over an interconnect layer having a conductive feature; depositing a protective layer over the etch stop layer; depositing a first dielectric layer over the protective layer; etching a via opening in the first dielectric layer, wherein the protective layer has a higher etch resistance to etching the via opening than that of the first dielectric layer; etching a portion of the protective layer exposed by the via opening; etching a portion of the etch stop layer exposed by the via opening, such that the via opening exposes the conductive feature; forming a bottom electrode via in the via opening; and forming a memory stack over the bottom electrode via.

20 Claims, 17 Drawing Sheets

INTEGRATED CIRCUIT AND FABRICATION METHOD THEREOF

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MU), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
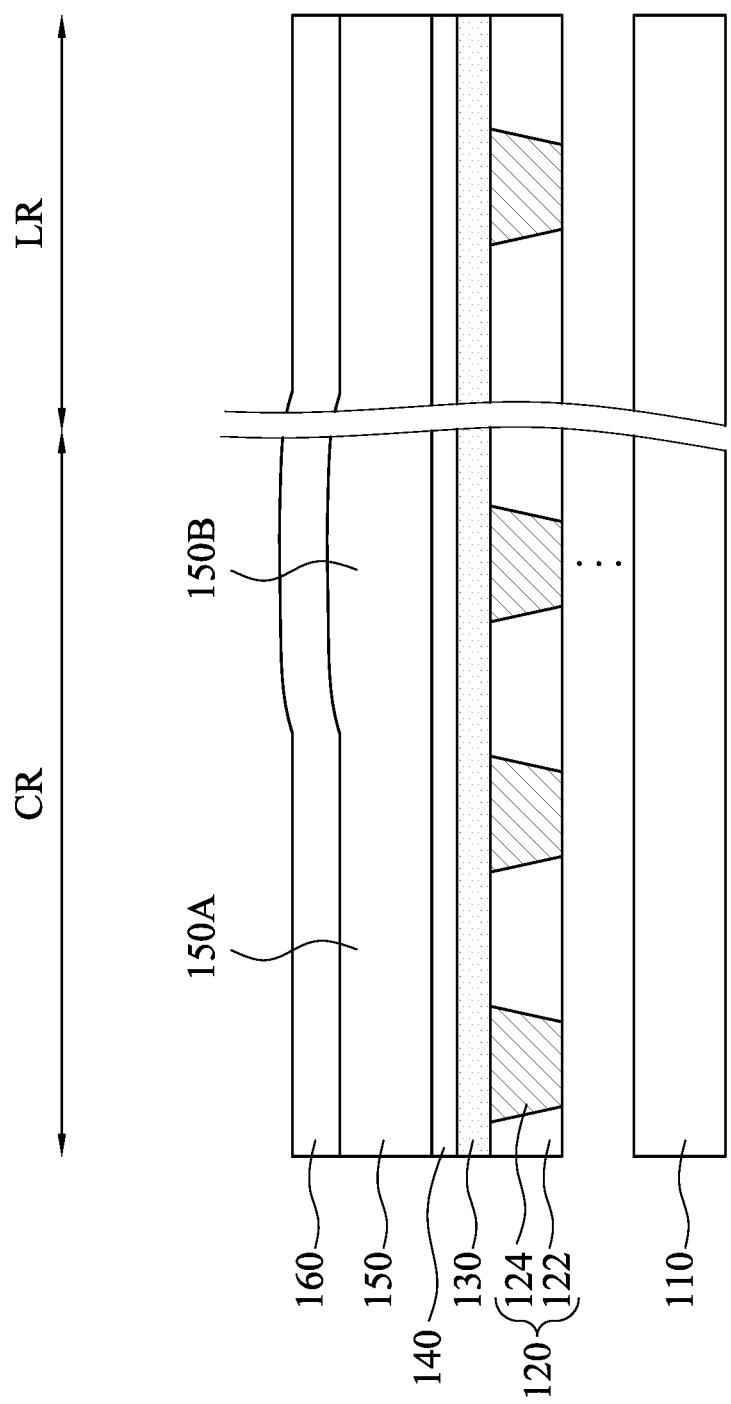
FIGS. 1-13 are cross-sectional views of an integrated circuit at various intermediate stages of manufacture according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments of this disclosure, an integrated circuit includes a magnetoresistive random access memory (MRAM) device. The MRAM device includes a magnetic tunnel junction (MTT) stack. The resistance switching element includes a tunnel barrier layer formed between a ferromagnetic pinned layer and a ferromagnetic free layer. The tunnel barrier layer is thin enough (such a few nanometers) to permit electrons to tunnel from one ferromagnetic layer to the other. A resistance of the resistance switching element is adjusted by changing a direction of a magnetic moment of the ferromagnetic free layer with respect to that of the ferromagnetic pinned layer. When the magnetic moment of the ferromagnetic free layer is parallel to that of the ferromagnetic pinned layer, the resistance of the resistance switching element is in a lower resistive state, corresponding to a digital signal "0". When the magnetic moment of the ferromagnetic free layer is anti-parallel to that of the ferromagnetic pinned layer, the resistance of the resistance switching element is in a higher resistive state, corresponding to a digital signal "1". The resistance switching element is coupled between top and bottom electrode and an electric current flowing through the resistance switching element (tunneling through the tunnel barrier layer 194) from one electrode to the other is detected to determine the resistance and the digital signal state of the resistance switching element.

According to some embodiments of this disclosure, the MRAM device is formed within a chip region of a substrate. A plurality of semiconductor chip regions are marked on the substrate by scribe lines between the chip regions. The substrate will go through a variety of cleaning, layering, patterning, etching and doping steps to form the MRAM devices. The term "substrate" herein generally refers to a bulk substrate on which various layers and device elements are formed. In some embodiments, the bulk substrate includes silicon or a compound semiconductor, such as GaAs, InP, SiGe, or SiC. Examples of the layers include dielectric layers, doped layers, polysilicon layers or conductive layers. Examples of the device elements include transistors, resistors, and/or capacitors, which may be interconnected through an interconnect layer to additional integrated circuits.

FIG. 1 illustrates a substrate 110 having an interconnect layer 120 thereon. The substrate 110 has a logic region LR where logic circuits are to be formed and a memory region CR where memory devices are to be formed. The substrate 110 may be a silicon substrate. Alternatively, the substrate 110 may comprise another elementary semiconductor, such as germanium; a compound semiconductor including silicon carbide; an alloy semiconductor including silicon germanium; or combinations thereof. In some embodiments, the substrate 110 is a semiconductor on insulator (SOI) substrate. The substrate may include doped regions, such as p-wells and n-wells. In the present disclosure, a wafer is a workpiece that includes a semiconductor substrate 110 and various features formed in and over and attached to the semiconductor substrate. The wafer may be in various stages of fabrication and is processed using the CMOS process. The transistors are formed by suitable transistor fabrication processes and may be a planar transistor, such as polysilicon gate transistors or high-k metal gate transistors, or a multi-gate transistor, such as fin field effect transistors. After the transistors are formed, one or more interconnect layer 120 of a multi-level interconnect (MLI) is formed over the transistors. The interconnect layer 120 includes an interlayer dielectric (ILD) layer or inter-metal dielectric (IMD) layer 122 with a metallization pattern 124 over the logic region LR and the memory region CR. The ILD layer 122 may be silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The metallization pattern 124 may be aluminum, aluminum alloy, copper, copper alloy, titanium, titanium nitride, tantalum, tantalum nitride, tungsten, cobalt, the like, and/or combinations thereof. Formation of the metallization pattern 124 and the ILD layer 122 may be a dual-damascene process and/or a single-damascene process. The substrate 110 may also include active and passive devices, for example, underlying the interconnect layer 120. These further components are omitted from the figures for clarity.

In some embodiments, an etch stop layer 130, a protective layer 140, a dielectric layer 150, and a polish stop layer 160 are formed over the interconnect layer 120 in a sequence. The etch stop layer 130 may have a high etch resistance to one or more subsequent etching processes. The etch stop layer 130 may be formed of dielectric material different from the underlying ILD layer 122. For example, the ILD layer 122 may be a silicon oxide layer, and the etch stop layer 130 may be a silicon nitride layer.

The protective layer 140 may be formed of dielectric material different from the etch stop layer 130 and the dielectric layer 150. In some embodiments, the protective layer 140 is a metal-containing compound layer, such as an aluminum-containing compound layer (Al-based layer). By way of example, the protective layer 140 is made from $Al_2O_3$, $AlO_x$, AlN, AlON, the combination thereof, or the like. In some other embodiments, the protective layer 140 may be made of SiC, diamond-like carbon (DLC), ashable hardmask (AHM) that may include nitrides, the combination thereof, or the like. In some embodiments, the protective layer 140 can be a single layer or a multi-layered structure. The protective layer 140 may have a thickness in a range of about 30 angstroms to about 100 angstroms, but other ranges are within the scope of various embodiments of the present disclosure. If the thickness of the protective layer 140 is greater than about 100 angstroms, it will suffer seriously lateral etching when removing the protective layer 140. If the thickness of the protective layer 140 is less than about 30 angstroms, opening etching process in the layers over the protective layer 140 with heavy over etching will breakthrough the protective layer 140.

The dielectric layer 150 in some embodiments is silicon oxynitride (SiON), silicon nitride (SiN), carbon-doped silicon oxide, silicon carbon (SIC), silicon dioxide, TEOS, low-k dielectrics, black diamond, the like, and/or combinations thereof. The dielectric layer 150 may be a single-layered structure or a multi-layered structure. The dielectric layer 150 may be formed by acceptable deposition techniques, such as chemical vapor deposition (CVD), the like, and/or a combination thereof. The dielectric layer 150 may have a thickness in a range of about 500 angstroms to about 1800 angstroms, but other ranges are within the scope of various embodiments of the present disclosure. If the thickness of the dielectric layer 150 is greater than about 1800 angstroms, the tungsten deposition will suffer overhang and induce void in BEVA (e.g., the filling metal 174 in BEVA 170 shown in FIGS. 5A-5B) due to high aspect ratio. If the thickness of the dielectric layer 150 is less than about 500 angstroms, the IBE etching will breakthrough dielectric layer 150 and then damage the etch stop layer 132 and the interconnect layer 120 including the ILD layer 122 and the metallization pattern 124). Due to process variation, the dielectric layer 150 may have some thickness variation. For example, the dielectric layer 150 may have a thin portion 150A and a thick portion 150B.

The polish stop layer 160 in some embodiments is silicon dioxide, such as silicon-rich oxide (SRO), undoped silicon glass (USG), phosphosilicate glass (PSG), fluorinated silica glass (FSG), borophosphosilicate glass (BPSG). The polish stop layer 160 may be formed by acceptable deposition techniques, such as chemical vapor deposition (CVD), the like, and/or a combination thereof. In some embodiments, the polish stop layer 160 has a thickness less than that of the dielectric layer 150.

In some embodiments, the dielectric layer 150 may include a carbon atomic concentration greater than that of the polish stop layer 160, such that the dielectric layer 150 may have a higher etch resistance to the subsequent ion-beam etching (IBE) process than that of the polish stop layer 160. In other word, an etch rate of the dielectric layer 150 is slower than that of the polish stop layer 160 during the IBE process. Through the material configuration, the dielectric layer 150, which is designed for preventing the IBE process from damage the underlying protective layer 140, can have a lowered thickness, which in turn may reduce a step height between the cell region CR and the logic region LR. For example, the dielectric layer 150 may include carbon-doped silicon oxide.

In some embodiments, the polish stop layer 160 may include a silicon atomic concentration higher than that of the dielectric layer 150, such that the polish stop layer 160 may have a higher polish resistance to the subsequent CMP process than that of the dielectric layer 150. In other word, a polish rate of the polish stop layer 160 is slower than that of the dielectric layer 150 during the IBE process. For example, the polish stop layer 160 may include silicon-rich oxide (SRO).

Figure 2:
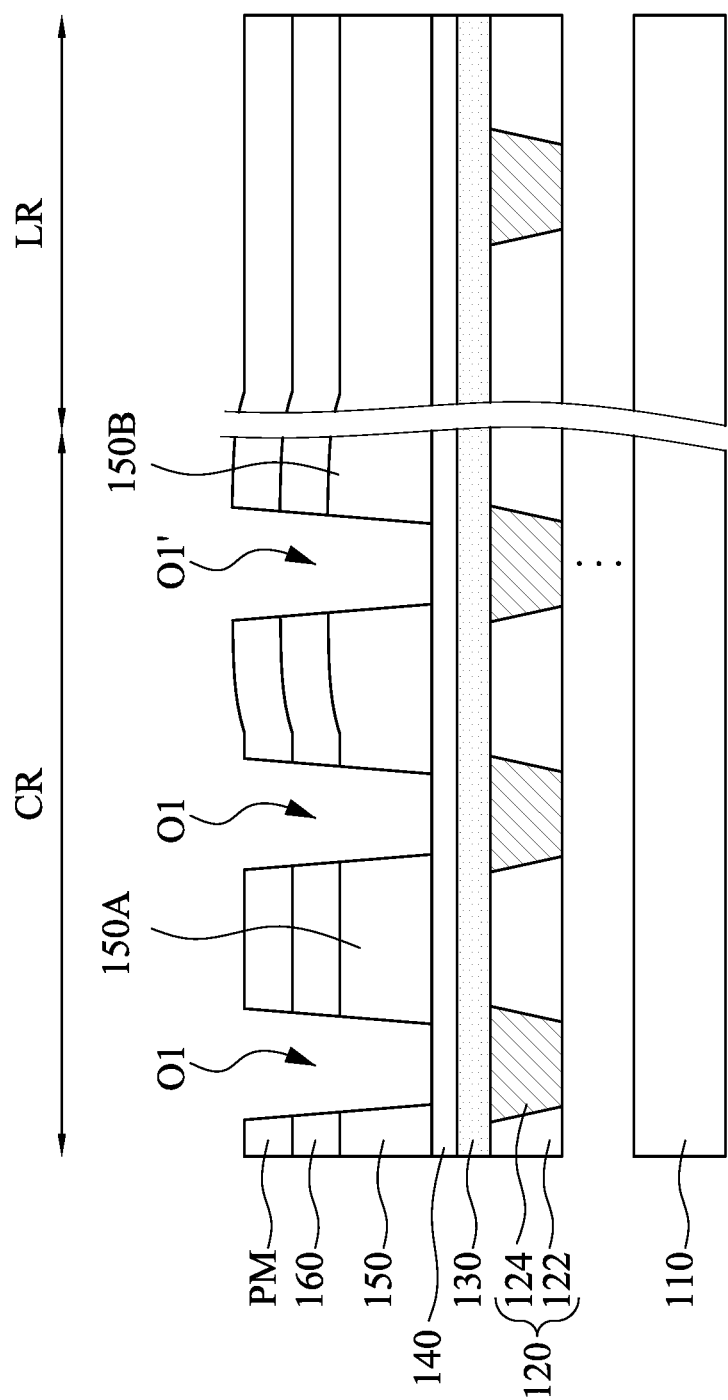

Reference is then made to FIG. 2. The polish stop layer 160 and the dielectric layer 150 are patterned to form openings O1 and O1' in the memory region CR. An exemplary patterning method includes forming a patterned mask PM may over the structure of FIG. 1, and then etching the polish stop layer 160 and the dielectric layer 150 through the patterned mask PM by one or more etching processes. The patterned mask PM is forming by patterning a resist layer (e.g., a photoresist layer) using a suitable photolithography process. The patterned mask PM acts as an etching mask during the etching process. The etching processes may be a dry etching process. The protective layer 140 may have a higher etch resistance to the etching processes than that of the polish stop layer 160 and the dielectric layer 150, thereby protecting underlying layers from being etched. For example, in an etching process using dilute HF, HF vapor, $CF_4$, $C_4F_8$, $CH_xF_y$, $C_xF_y$, $SF_6$, or $NF_3$ gas as an etchant, an etch rate of the protective layer 140 is slower than that of at least one of the dielectric layer 150. After the patterning process, the openings O1 and O1' may expose portions of the protective layer 140. After the patterning process, the patterned mask PM may be removed by suitable ashing process. The protective layer 140 may remain substantially intact after removing the patterned mask PM.

In the absence of the protective layer 130, the etching process may damage the etch stop layer 130 and the underlying layers. With the presence of the protective layer 140, the etching process can be performed in an over-etching (e.g., for a long etching time) manner for covering the thickness variations of the layers 150-160, which in turn further enlarges the landing window for the openings O1 and O1'.

Figure 3A:
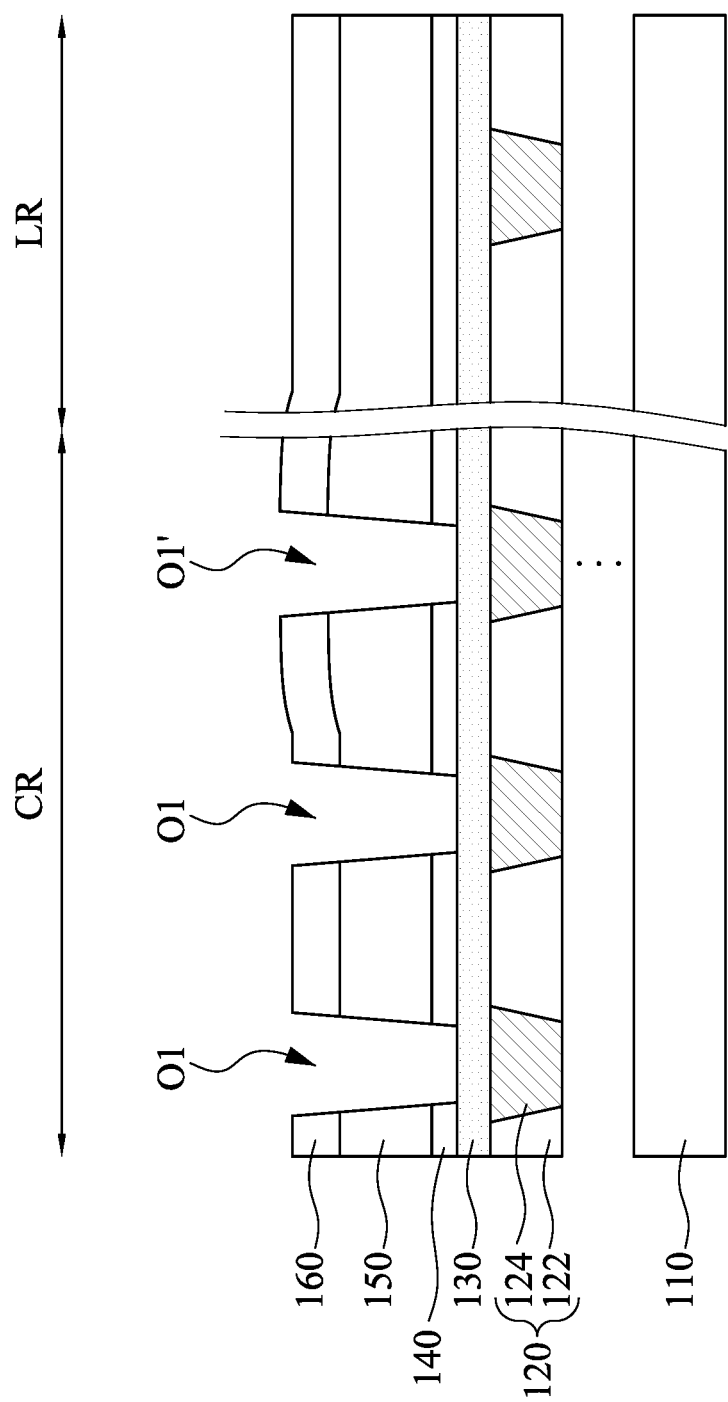

Reference is then made to FIG. 3A. The portions of the protective layer 140 exposed by the openings O1 and O1' may be removed by suitable etching process, such as a wet etching process. For example, in some embodiments where the protective layer 140 is $AlO_x$, the etchant used in wet etching process can be dilute hydrofluoric acid (HF). The etch stop layer 130 may have a higher etch resistance to the etchant than that of the protective layer 140, thereby protecting underlying layers from being etched. That is, the etching process may not consume the etch stop layer 130. In some embodiments, the etching process may also consume a top surface of the polish stop layer 160 and sidewalls of the polish stop layer 160 and the dielectric layer 150. In some alternative embodiments, a dry etch process may be used for removing the portions of the protective layer 140. After the etching process, the openings O1 and O1' is deepened to expose portions of the etch stop layer 130.

Figure 3B:
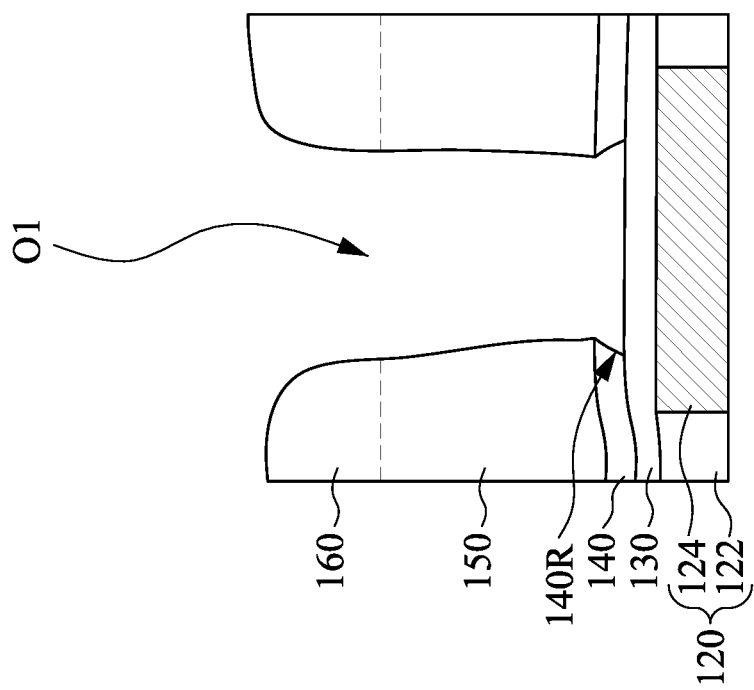

FIG. 3B is an enlarged view of a portion of FIG. 3A. In some embodiments, due to the heterogeneous materials (for etch selectivity) among the dielectric layer 150, the protective layer 140, and the etch stop layer 130, the etching process may result in recesses 140R on sidewalls of the protective layer 140.

Figure 4A:
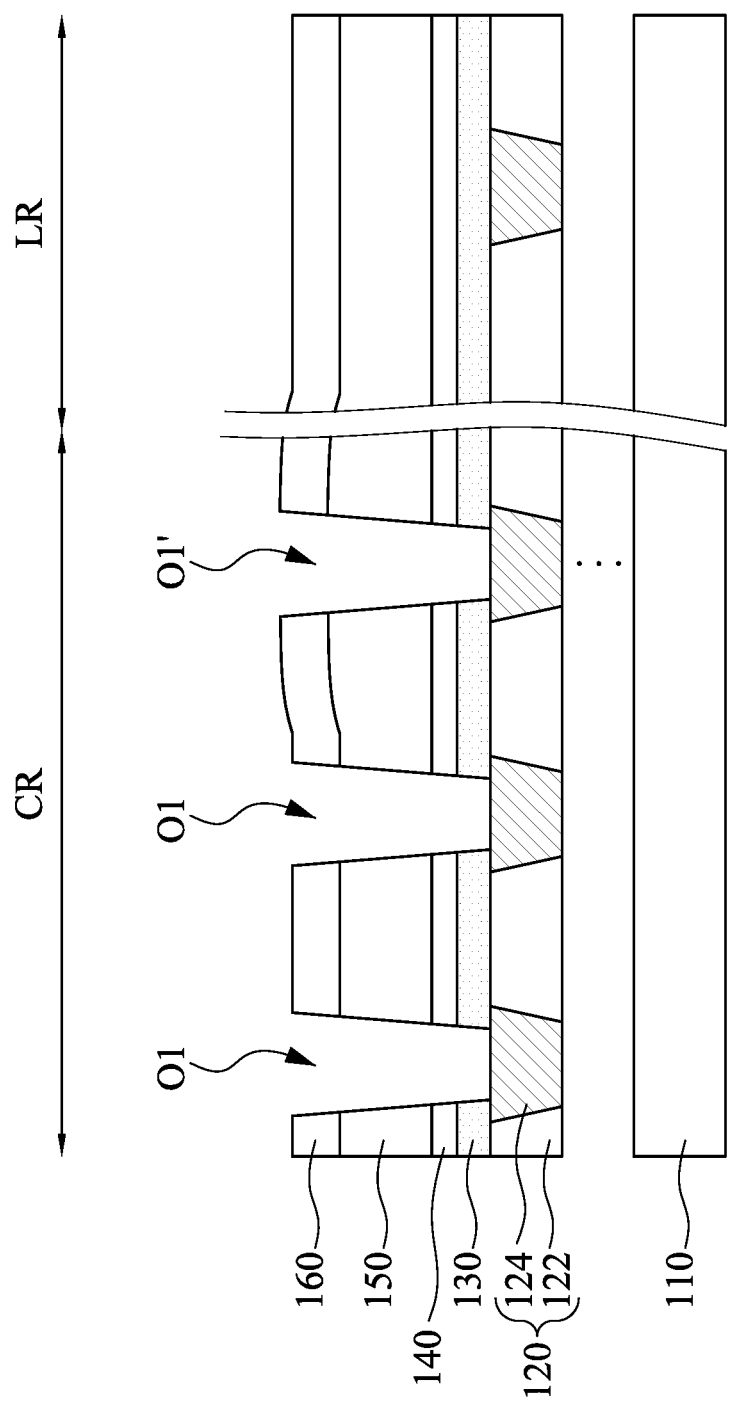

Reference is then made to FIG. 4A. The portions of the etch stop layer 130 exposed by the openings O1 and O1' may be removed by a liner removal process, which may include suitable etching process. For example, a dry etch process using a suitable gas etchant (e.g., fluoride-based gas) is performed to remove the portions of the etch stop layer 130. The metallization pattern 124 may have a higher etch resistance to the gas etchant than that of the etch stop layer 130, thereby protecting underlying layers from being etched. After the etch process, the openings O1 and O1' are deepened to expose portions of the metallization pattern 124.

Figure 4B:
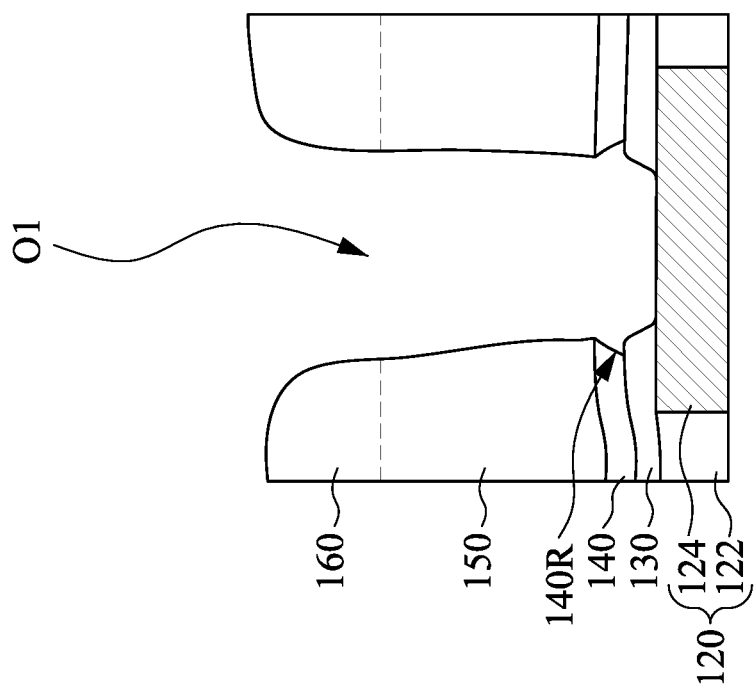

FIG. 4B is an enlarged view of a portion of FIG. 4A. In some embodiments, due to the heterogeneous materials (for etch selectivity) among the dielectric layer 150, the protective layer 140, and the etch stop layer 130, the etching processes in FIGS. 2-4B are performed such that the openings O1/O1' extends further into the protective layer 140 than into the dielectric layer 150 and the etch stop layer 130. For example, the recesses 140R are on sidewalls of the protective layer 140 and between the upper dielectric layer 150 and the underlying etch stop layer 130.

Figure 5A:
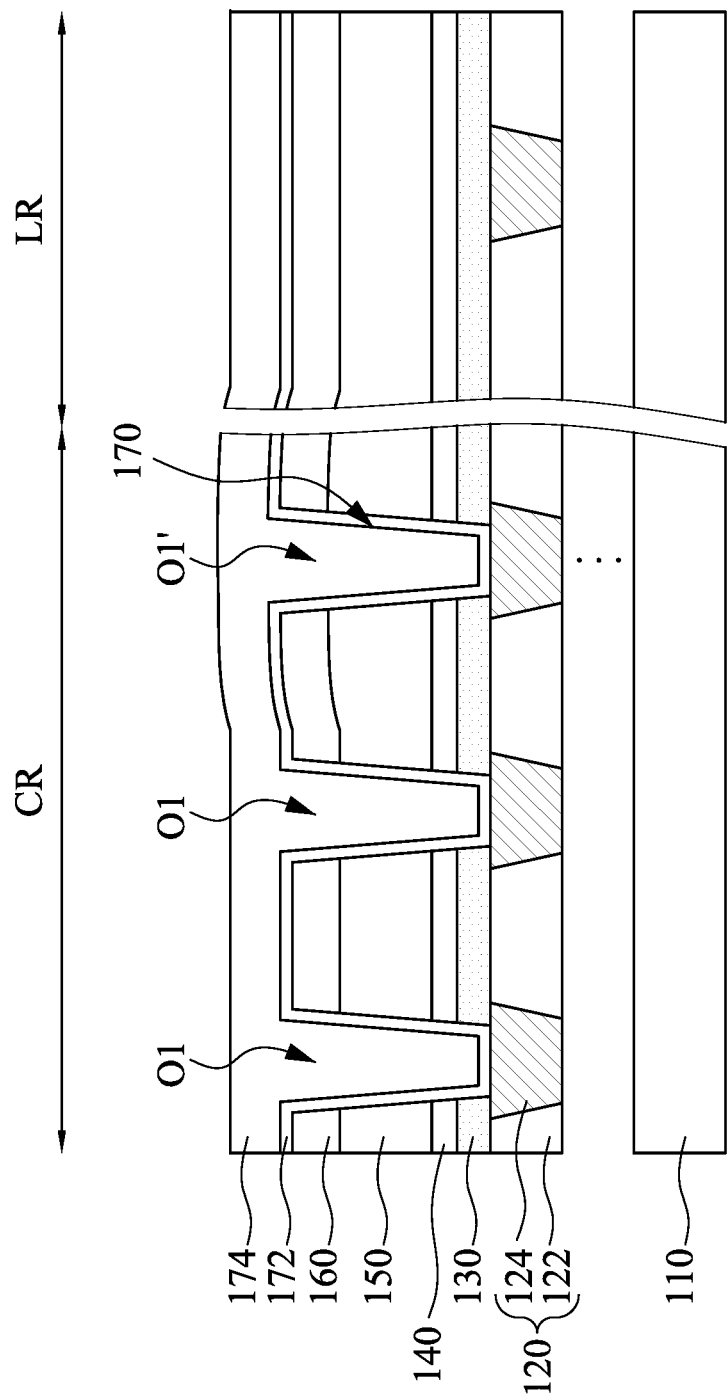

Reference is then made to FIG. 5A. The openings O1 and O1' are overfilled with a conductive material. For example, a diffusion barrier layer 172 is deposited over the structure of FIG. 4A, and then a filling metal 174 is deposited on the diffusion barrier layer 172 and filling the openings O1 and O1'. The filling metal 174 may fill recesses in the diffusion barrier layer 172. In some embodiments, the diffusion barrier layer 172 is a titanium nitride (TiN) layer or a tantalum nitride (TaN) layer, which can act as a suitable barrier to prevent metal diffusion. Formation of the diffusion barrier layer 172 may be exemplarily performed using CVD, PVD, ALD, the like, and/or a combination thereof. In some embodiments, the filling metal 174 is titanium (Ti), tantalum (Ta), platinum (Pt), ruthenium (Ru), tungsten (W), aluminum (Al), copper (Cu), the like, and/or combinations thereof. Formation of the filling metal 174 may be exemplarily performed using CVD, PVD, ALD, the like, and/or a combination thereof. In some embodiments, a combination of a portion of the diffusion barrier layer 172 and a portion of the filling metal 174 in the openings O1/O1' can be referred to as a bottom electrode via (BEVA) 170.

Figure 5B:
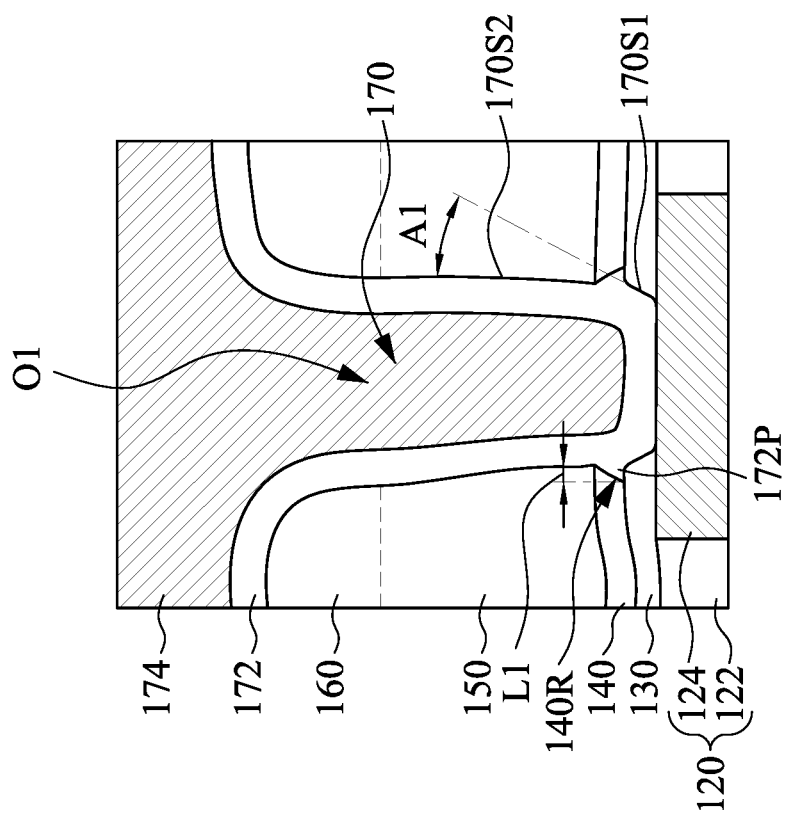

FIG. 5B is an enlarged view of a portion of FIG. 5A. Reference is made to FIGS. 5A and 5B. The diffusion barrier layer 172 may be deposited into the recesses 140R and filling the recesses 140R. For example, the diffusion barrier layer 172 may have a protruding portion 172P adjoining the protective layer 140 in the recesses 140R. The protruding portion 172P of the BEVA 170 may be at least partially over a top surface of the etch stop layer 130, thereby being at a position higher than a bottom of the BEVA 170. In some embodiments, the BEVA 170 may have sidewalls 170S1 and 170S2 adjoining etch stop layer 130 and the dielectric layer 150, respectively. The protruding portion 172P of the BEVA 170 may extend beyond the sidewalls 170S1 and 170S2. For example, a length L1 of the protruding portion 172P extending beyond the sidewalls 170S1 and 170S2 may be in a range from about 0 angstrom to about 50 angstroms, but other ranges are within the scope of various embodiments of the present disclosure.

In some embodiments, the heterogeneous materials among the dielectric layer 150, the protective layer 140, and the etch stop layer 130 affects the shapes of the openings O1 and O1', such that the sidewall 170S1 of the BEVA 170 adjoining the etch stop layer 130 is slanted with respect to the sidewall 170S2 of the BEVA 170 adjoining the dielectric layer 150. For example, an angle A1 between the sidewalls 170S1 and 170S2 may be in a range from about 5 degrees to about 12 degrees, but other ranges are within the scope of various embodiments of the present disclosure.

Figure 6:
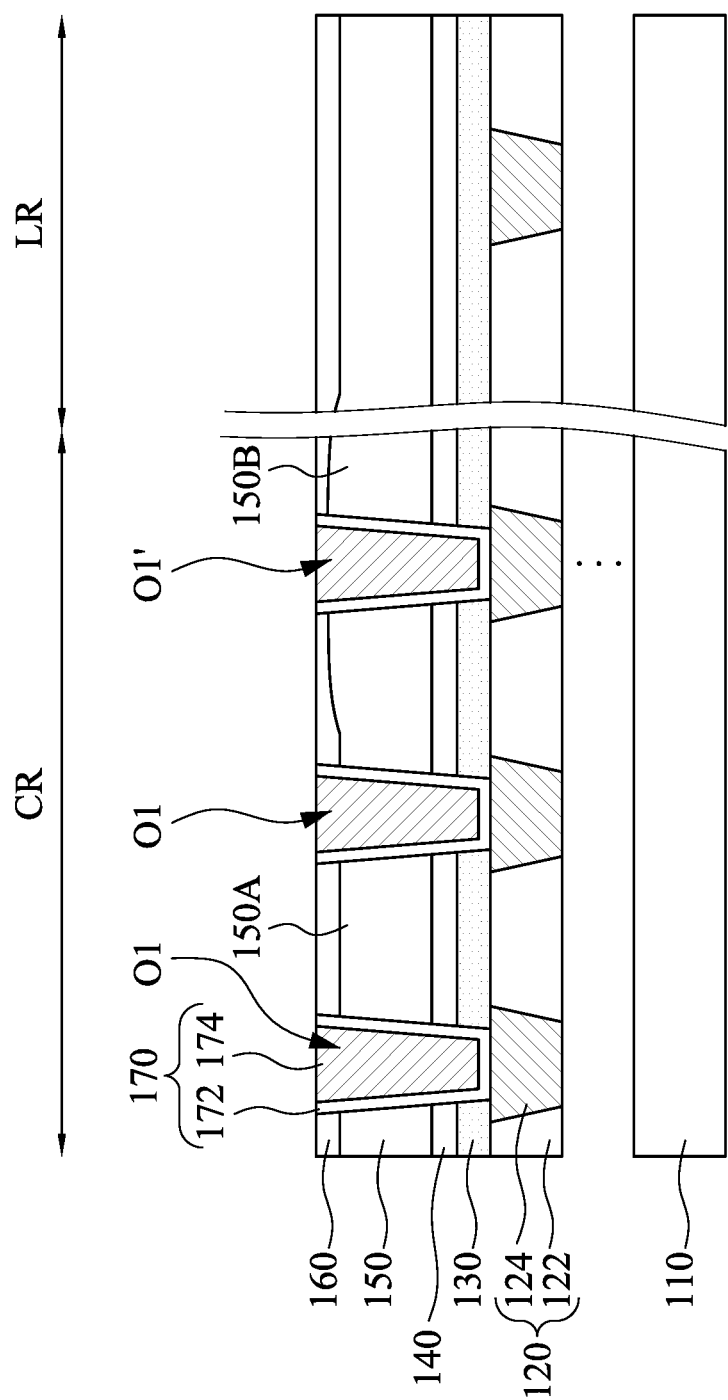

Reference is then made to FIG. 6. A planarization process, such as a chemical-mechanical polish (CMP) process, is performed to remove excess materials of the filling metal 174 and of the diffusion barrier layer 172 outside the openings O1 and O1'. The planarization process may stop when reaching the polish stop layer 160. In some embodiments, the polish stop layer 160 may have a higher polish resistance to the planarization process than that of the dielectric layer 150. After the planarization process, the remaining diffusion barrier layer 172 and the remaining filling metal 174 can serve as the BEVAs 170 in the openings O1 and O1'. In some embodiments, the BEVAs 170 are electrically connected to an underlying electrical component, such as a transistor, through the metallization pattern 124.

Figure 7:
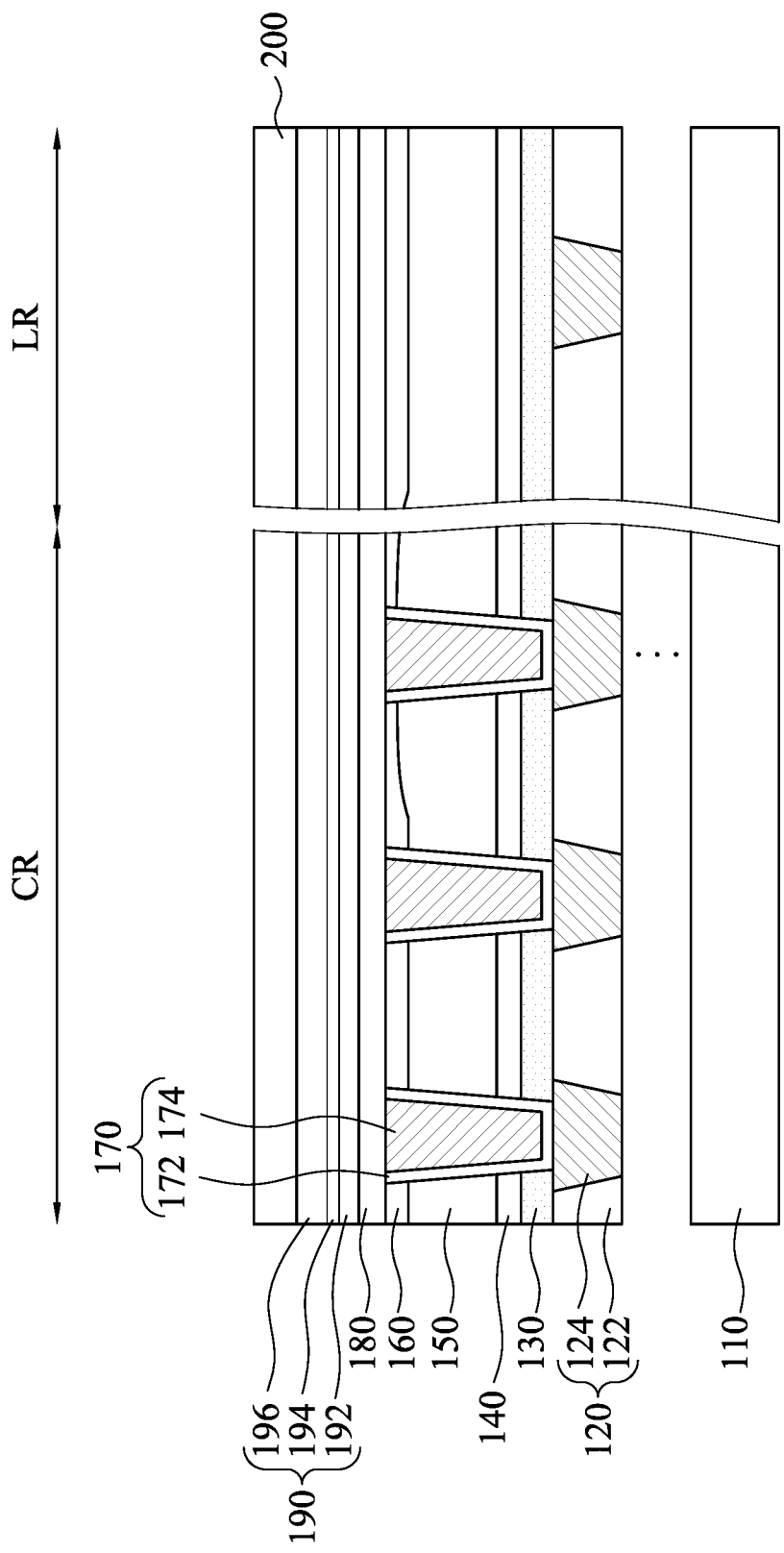

Reference is made to FIG. 7. A blanket bottom electrode layer 180 is then formed over the BEVAs 170 and over the polish stop layer 160, so that the bottom electrode layer 180 extends along top surfaces of the BEVAs 170 and of the polish stop layer 160. The bottom electrode layer 180 can be a single-layered structure or a multi-layered structure. The bottom electrode layer 180 includes a material the same as the filling metal 174 in some embodiments. In some other embodiments, the bottom electrode layer 180 includes a material different from the filling metal 174. In some embodiments, the bottom electrode layer 180 is titanium (Ti), tantalum (Ta), platinum (Pt), ruthenium (Ru), tungsten (W), aluminum (Al), copper (Cu), TiN, TaN, the like, and/or a combination thereof. Formation of the bottom electrode layer 180 may be exemplarily performed using CVD, PVD, ALD, the like, and/or a combination thereof.

A resistance switching layer 190 is formed over the bottom electrode layer 180. In some embodiments, the resistance switching layer 190 may be a magnetic tunnel junction (MTJ) structure. To be specific, the resistance switching layer 190 includes at least a first magnetic layer 192, a tunnel barrier layer 194, and a second magnetic layer 196 196 are formed in sequence over the bottom electrode layer 180. The magnetic moment of the second magnetic layer 196 may be programmed causing the resistance of the resulting MTJ cell to be changed between a high resistance and a low resistance.

In some embodiments, the first magnetic layer 192 includes an anti-ferromagnetic material (AFM) layer over the bottom electrode layer 180 and a ferromagnetic pinned layer over the AFM layer. In the anti-ferromagnetic material (AFM) layer, magnetic moments of atoms (or molecules) align in a regular pattern with magnetic moments of neighboring atoms (or molecules) in opposite directions. A net magnetic moment of the AFM layer is zero. In certain embodiments, the AFM layer includes platinum manganese (PtMn). In some embodiments, the AFM layer includes iridium manganese (IrMn), rhodium manganese (RhMn), iron manganese (FeMn), or OsMn. An exemplary formation method of the AFM layer includes sputtering, PVD, ALD or the like.

The ferromagnetic pinned layer in the first magnetic layer 192 forms a permanent magnet and exhibits strong interactions with magnets. A direction of a magnetic moment of the ferromagnetic pinned layer can be pinned by an anti-ferromagnetic material (AFM) layer and is not changed during operation of a resulting resistance switching element fabricated from the resistance switching layer 190. In certain embodiments, the ferromagnetic pinned layer includes cobalt-iron-boron (CoFeB). In some embodiments, the ferromagnetic pinned layer includes CoFeTa, NiFe, Co, CoFe, CoPt, or the alloy of Ni, Co and Fe. An exemplary formation method of the ferromagnetic pinned layer includes sputtering, PVD, ALD, thermal or e-beam evaporated deposition. In some embodiments, the ferromagnetic pinned layer includes a multilayer structure.

The tunnel barrier layer 194 is formed over the first magnetic layer 192. The tunnel barrier layer 194 can also be referred to as a tunneling layer, which is thin enough that electrons are able to tunnel through the tunnel barrier layer 194 when a biasing voltage is applied to a resulting resistance switching element fabricated from the resistance switching layer 190. In certain embodiments, the tunnel barrier layer 194 includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). An exemplary formation method of the tunnel barrier layer 194 includes sputtering, PVD, ALD, e-beam or thermal evaporated deposition, or the like.

The second magnetic layer 196 is formed over the tunnel barrier layer 194. The second magnetic layer 196 is a ferromagnetic free layer in some embodiments. A direction of a magnetic moment of the second magnetic layer 196 is not pinned because there is no anti-ferromagnetic material in the second magnetic layer 196. Therefore, the magnetic orientation of this layer is adjustable, thus the layer is referred to as a free layer. In some embodiments, the direction of the magnetic moment of the second magnetic layer 196 is free to rotate parallel or anti-parallel to the pinned direction of the magnetic moment of the ferromagnetic pinned layer in the first magnetic layer 192. The second magnetic layer 196 may include a ferromagnetic material similar to the material in the ferromagnetic pinned layer in the first magnetic layer 192. Since the second magnetic layer 196 has no anti-ferromagnetic material while the first magnetic layer 192 has an anti-ferromagnetic material therein, the first and second magnetic layers 192 and 196 and have different materials. In certain embodiments, the second magnetic layer 196 includes cobalt, nickel, iron or boron, compound or alloy thereof. An exemplary formation method of the second magnetic layer 196 includes sputtering, PVD, ALD, e-beam or thermal evaporated deposition, or the like.

A top electrode layer 200 is formed over the resistance switching layer 190. The top electrode layer 200 includes a conductive material. In some embodiments, the top electrode layer 200 is similar to the bottom electrode layer 180 in terms of composition. In some embodiments, the top electrode layer 200 comprises titanium (Ti), tantalum (Ta), platinum (Pt), ruthenium (Ru), tungsten (W), aluminum (Al), copper (Cu), the like or combinations thereof. An exemplary formation method of the top electrode layer 200 includes sputtering, PVD, ALD or the like.

Figure 8:
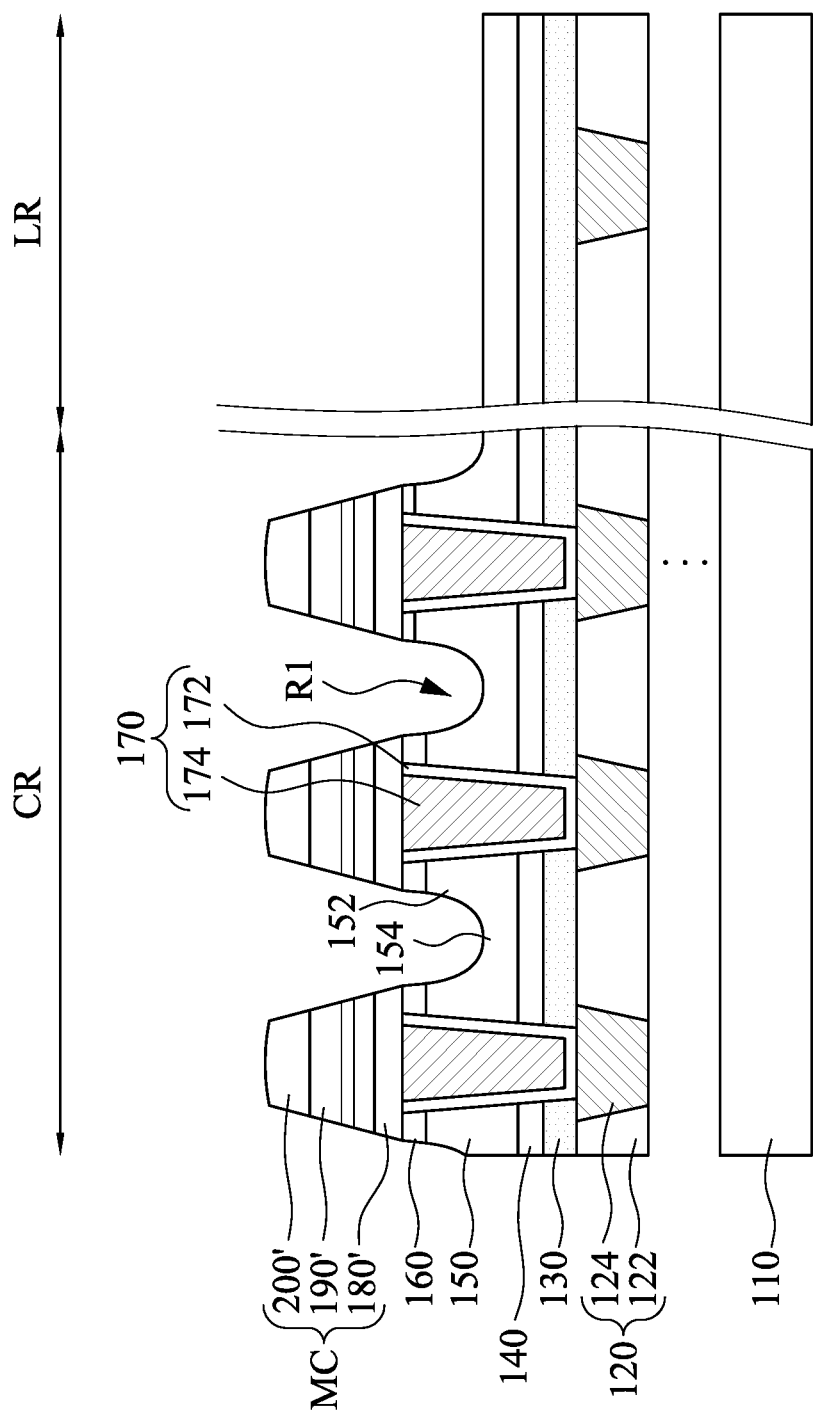

Reference is made to FIG. 8. The top electrode layer 200, the resistance switching layer 190, and the bottom electrode layer 180 (referring to FIG. 7) are respectively patterned to top electrodes 200', resistance switching elements 190', and bottom electrodes 180', thereby forming plural memory stacks MC. In the present embodiments, the patterning may include a directional physical dry etching process, such as IBE process. The IBE process may use an etchant gas such as a CHF series (e.g., $CHF_2$, $CHF_3$, $CF_4$, $CH_xF_y$, or $CH_3OH$), Kr, Ne, Ar, O, N, the like, or a combination thereof. The IBE process may be performed in a chamber with a rotatable stage or substrate table with more than one axis of rotation. This rotation allows a more uniform etch profile and allows control of the angle of incidence of the ion beam. The IBE process may be operated with an incident angle (i.e., angle between the ion beam direction and a line normal to the plane of the substrate 110) in a range from about 0 degree to about 10 degrees for vertical etch. The IBE process may have an end point detection system to allow the etching process to stop before etching through the underlying dielectric layer 150.

In some embodiments, the patterning process using the IBE process may also etch portions of the dielectric layer 150 and the polish stop layer 160, thereby forming recesses R1 in the remaining dielectric layer 150 and the polish stop layer 160. The recesses R1 may have a depth in a range of about 200 angstroms to about 1700 angstroms, but other ranges are within the scope of various embodiments of the present disclosure. For example, the remaining dielectric layer 150 includes portions 152 respectively surrounding the BEVAs 170 and portions 154 connected between two adjacent portions 152, and the portions 152 may be thicker than the portions 154. The portions 154 may have a thickness in a range of about 100 angstroms to about 1600 angstroms, but other ranges are within the scope of various embodiments of the present disclosure.

In some embodiments, the dielectric layer 150 may be designed with a suitable thickness for stopping the IBE process before reaching the interconnect layer 120. The thickness of the dielectric layer 150 may be so large that a thickness variation of the dielectric layer 150 can not be ignored. Due to the thickness variation of the dielectric layer 150, in absence of the protective layer 140, etching the openings O1 and O1' to expose portions of the metallization pattern 124 may result in under etch, which may result in open failure. For example, etching the openings O1 and O1' may be stop when the opening O1 just exposes the underlying portion of the metallization pattern 124, such that the openings O1' may not expose the underlying portion of the metallization pattern 124, which in turn will result in that the BEVAs 170 is disconnected from the underlying portion of the metallization pattern 124. For clear illustration, the openings O1 and O1' are respectively used herein for indicating the openings in the thin portion 150A and the thick portion 150B of the dielectric layer 150 (referring to FIG. 1).

In some embodiments of the present disclosure, by inserting the protective layer 140 between the etch stop layer 130 and the dielectric layer 150, etching the openings O1 and O1' in the layers 150-160 (e.g., the etching process in FIG. 2) may be stopped on the top surface of the protective layer 140 at substantially the same level, and then the openings O1 and O1' are deepened and etched through the layers 140 and 130 to expose the underlying portion of the metallization pattern 124 (e.g., the etching process in FIGS. 3A-4B). Through the configuration, the under etch issue due to thickness variation of the layers 150-160 is withdrawn, and BEVAs 170 in the opening O1' can be connected to the underlying portion of the metallization pattern 124. With the presence of the protective layer 140, the etching process can be performed in an over-etching (e.g., for a long etching time) manner for covering the thickness variations of the layers 150-160, the landing window for BEVA can be enlarged.

Figure 9:
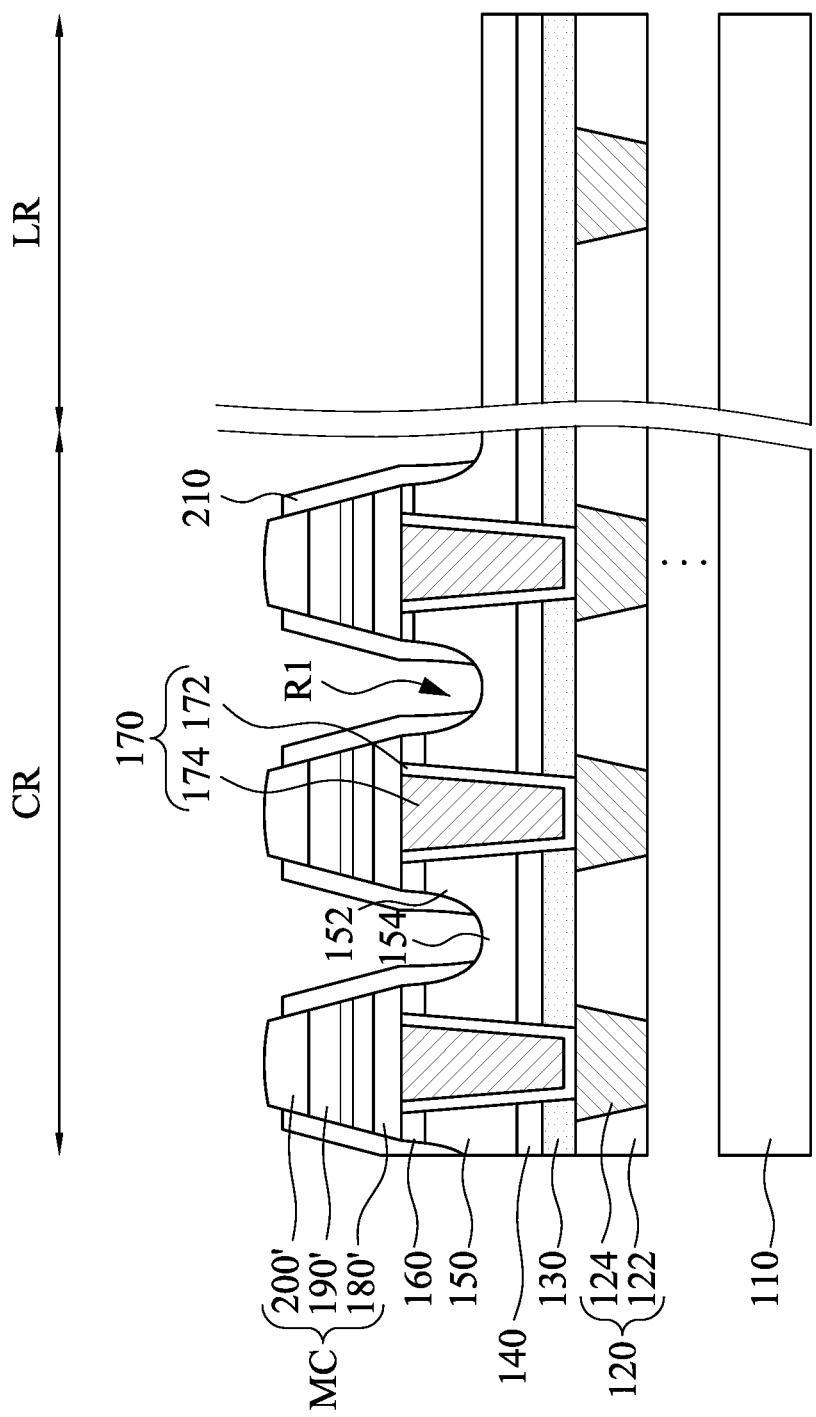

Reference is made to FIG. 9. At least one spacer 210 is formed along a sidewall of the memory stacks MC. The spacer 210 may include multiple layers. The spacer 210 in some embodiments may include SiN, but in other embodiments may include SiC, SiON, silicon oxycarbide (SiOC), the like, and/or combinations thereof. An exemplary formation method of the spacer 210 includes forming a spacer layer over the memory stacks MC and etching the spacer layer into the spacer 210. The spacer layer may be formed using CVD, PVD, ALD, the like, and/or combinations thereof. After the etching process, a portion of the top electrodes 200' is exposed by the spacer 210. In some embodiments, the spacer 210 is formed around and encloses the resistance switching elements 190'. In some other embodiments, the dielectric layer 150 may have a higher etch resistance to the etching process than that of the spacer 210, such that the etching process to the spacer layer may stop at the top surface of the dielectric layer 150.

Figure 10:
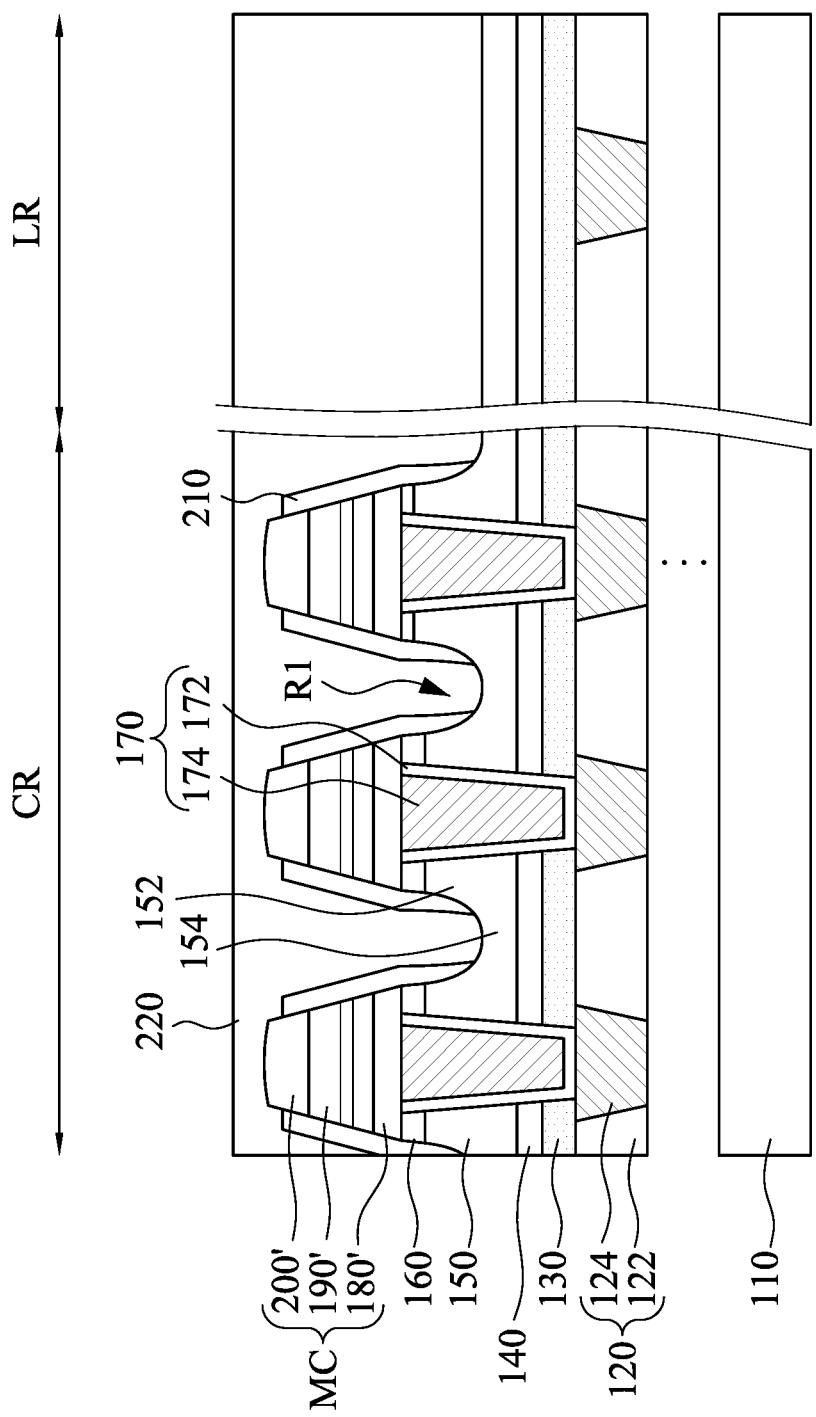

Reference is made to FIG. 10. Another ILD layer 220 is formed over the structure of FIG. 9. In some embodiments, the ILD layer 220 may have the same material as the ILD layer 122. In some other embodiments, the ILD layer 220 may have a different material than the ILD layer 122. In some embodiments, the ILD layer 220 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. An anti-reflection layer ARL2, for example, a nitrogen-free anti-reflection layer (NFARL) is optionally formed over the ILD layer 220.

Figure 11:
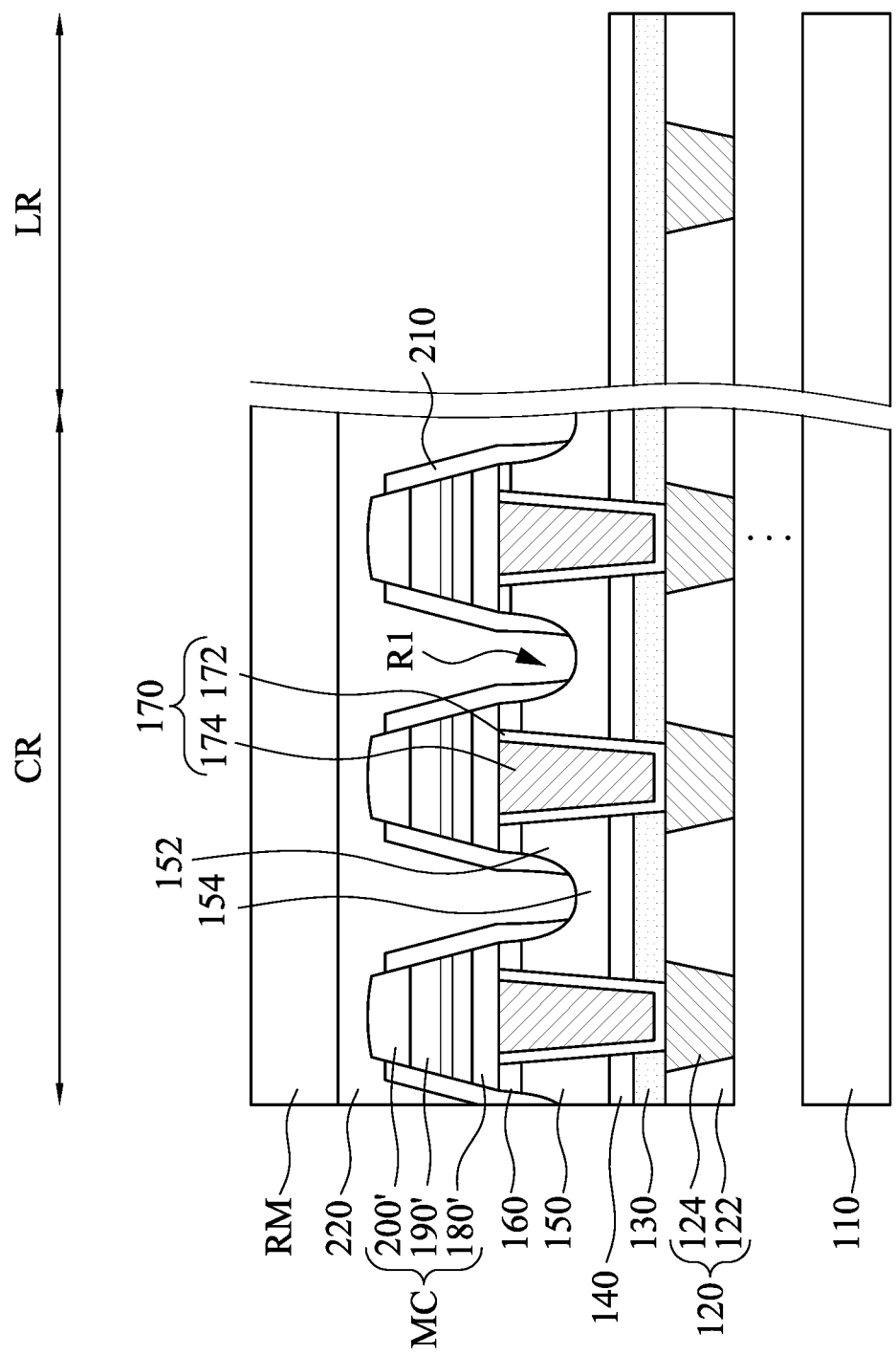

Reference is made to FIG. 11. Portions of the ILD layer 220 and the dielectric layer 150' in the logic region LR are removed. The removal may be performed by an etching process. In some embodiments where the ILD layer 220 is silicon oxide, the etchant used in etching the ILD layer 220 can be dilute hydrofluoric acid (HF), HF vapor, $CF_4$, $C_4F_8$, $CH_xF_y$, $C_xF_y$, $SF_6$, or $NF_3$ gas. After the etching process, the ILD layer 220 and the dielectric layer 150' are not in the logic region LR.

Herein, a resist mask RM is formed over the ILD layer 220. The resist mask RM is forming by patterning a resist layer (e.g., a photoresist layer) using a suitable photolithography process. The resist mask RM covers the memory region CR and exposes the logic region LR. The resist mask RM acts as an etching mask during the etching process, and the elements in the memory region CR are protected from being etched by the resist layer RM. In the absence of the protective layer 140, the etching process may damage the etch stop layer 130 and the underlying layers.

In some embodiments of the present disclosure, the protective layer 140 may has a higher etch resistance to the etching process than that of the ILD layer 220, the dielectric layer 150', and the etch stop layer 130. For example, in an etching process using dilute HF, HF vapor, $CF_4$, $C_4F_8$, $CH_xF_y$, $C_xF_y$, $SF_6$, or $NF_3$ gas as an etchant, an etch rate of the protective layer 140 is slower than that of at least one of the ILD layer 220, the dielectric layer 150' (referring to FIG. 10), and the etch stop layer 130. Through the configuration, the etching process in the logic region LR stops at the protective layer 140, and the etch stop layer 130 is protected by the protective layer 140 during the etching process. After the etching process, the resist mask RM may be removed by suitable ashing process.

Figure 12:
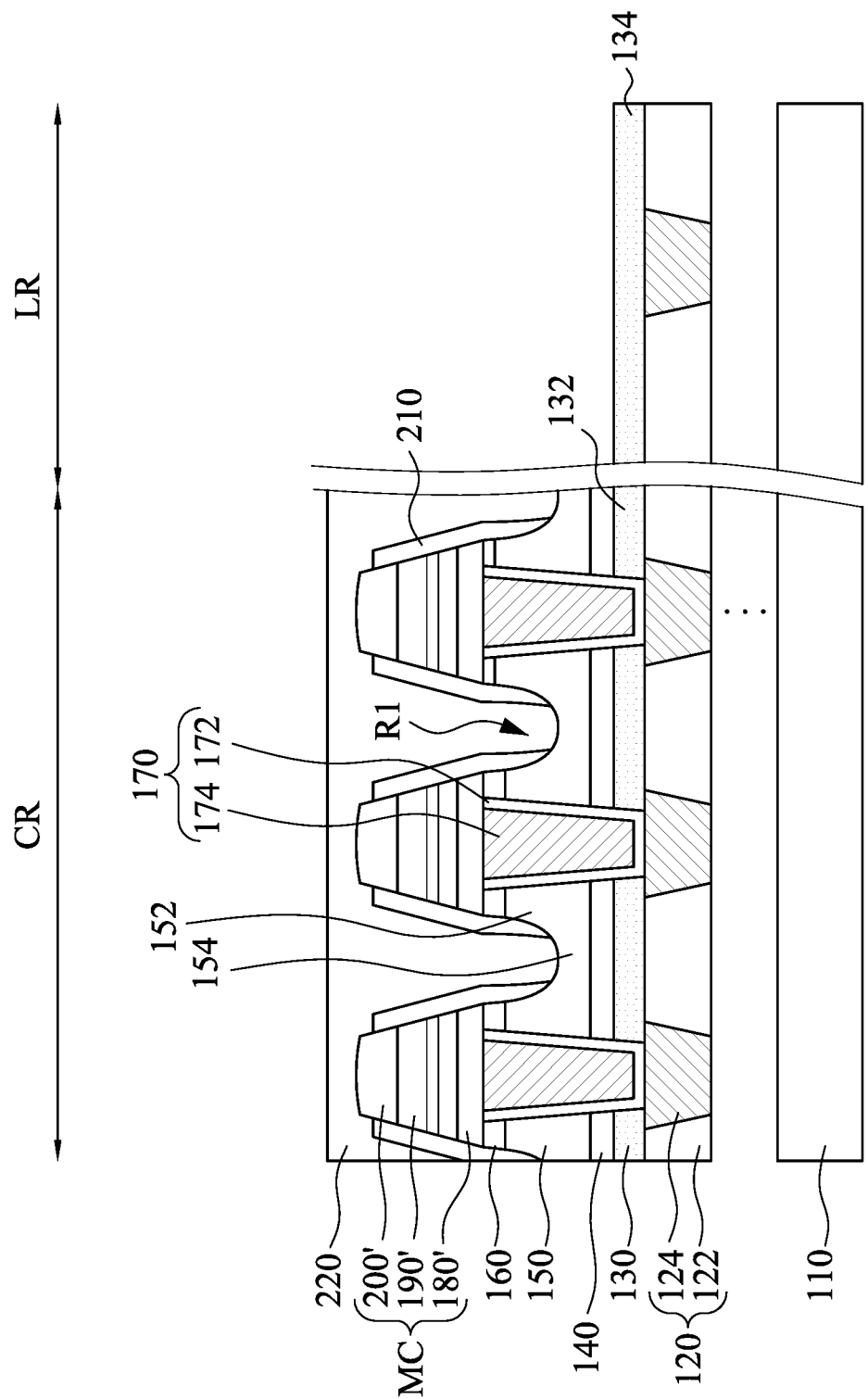

Reference is made to FIG. 12. A portion of the protective layer 140 in the logic region LR is removed. The removal may be performed by suitable etching process, such as a wet etching process. For example, in some embodiments where the protective layer 140 is $AlO_x$, the etchant used in wet etching process can be dilute hydrofluoric acid (HF). The etch stop layer 130 has a higher etch resistance to the etching process than that of the protective layer 140, such that the etching process stops at the etch stop layer 130. In some alternative embodiments, a dry etch process may be used for removing the portion of the protective layer 140. After the removal, the protective layer 140 is not in the logic region LR. For example, the protective layer 140 extends along a top surface of the first portion 132 of the etch stop layer 130 and terminating prior to reaching a top surface of the second portion 134 of the etch stop layer 130.

Herein, the etch stop layer 130 has a first portion 132 in the memory region CR and a second portion 134 in the logic region LR, and after the removal, the protective layer 140 covers the first portion 132 of the etch stop layer 130 and exposes the second portion 134 of the etch stop layer 130.

Reference is made to FIG. 12. Another ILD layer 230 is formed over the substrate 110. In some embodiments, the ILD layer 230 may have the same material as the ILD layer 220 or the dielectric layer 150. In some other embodiments, the ILD layer 230 may have a different material than the ILD layer 220 or the dielectric layer 150. In some embodiments, the ILD layer 230 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof.

Figure 13:
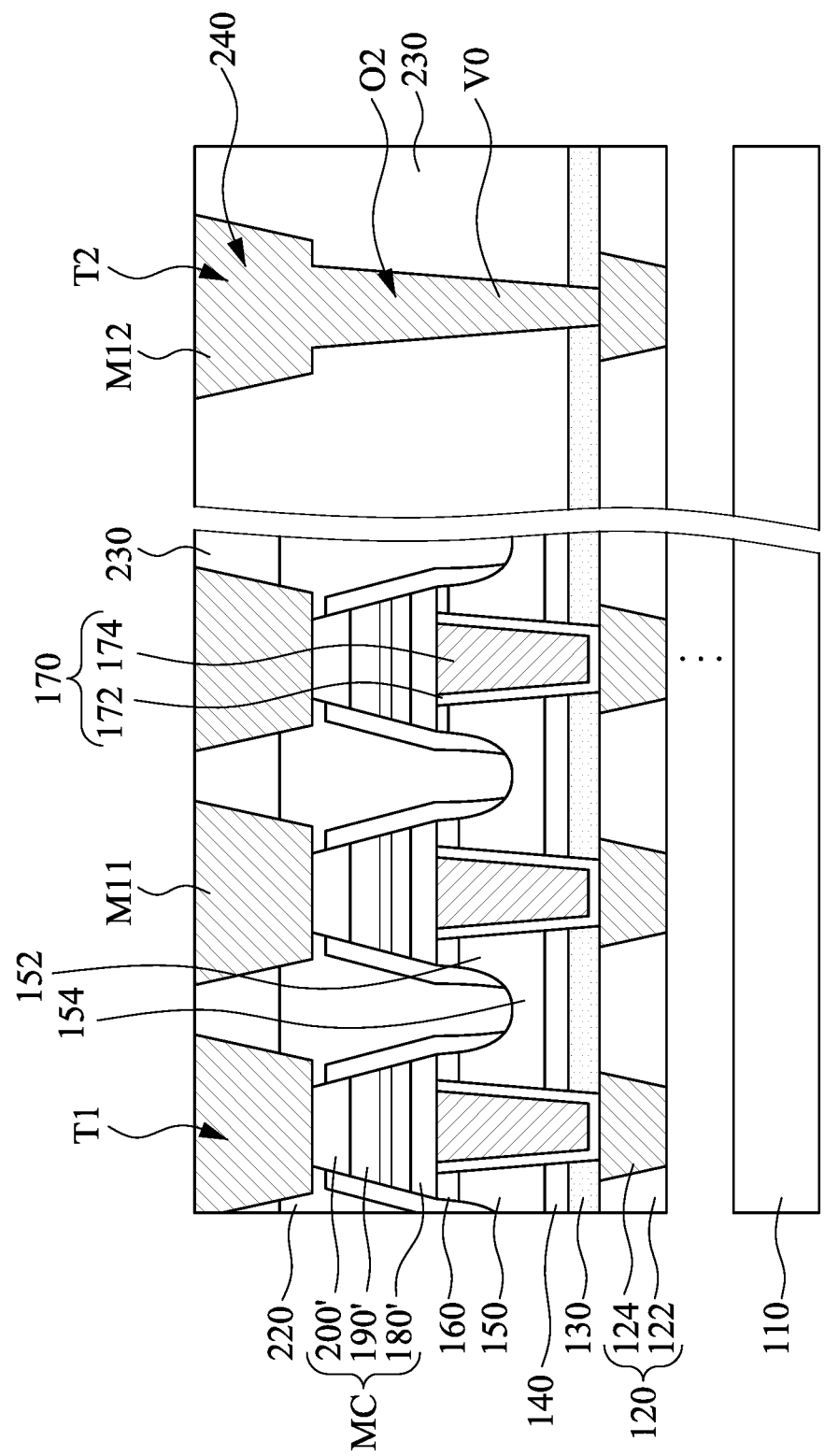

Reference is made to FIG. 13. A metallization pattern 240 is then formed in the ILD layer 230. Formation of the metallization pattern 240 may be formed by etching trench openings T1 and T2 in the ILD layers 220 and 230 respectively in the cell region CR and logic region LR, etching via openings O2 in the ILD layer 230 and the second portion 134 of the etch stop layer 130, and then filling one or more metals (e.g., copper) in the trench openings T1 and T2 and the via opening O2 to form the metallization pattern 240. In some embodiments where the ILD layer 220 and 230 are silicon oxide, the etchant used in etching the trench openings T1 and T2 and the via opening O2 can be dilute hydrofluoric acid (HF), HF vapor, $CF_4$, $C4F_8$, $CH_xF_y$, $C_xF_y$, $SF_6$, or $NF_3$ gas.

In some embodiments, the etch stop layer 130 may has a higher etch resistance to the etching the via openings O2 than that of the ILD layer 230. For example, in an etching process using dilute HF, HF vapor, $CF_4$, $C_4F_8$, $CH_xF_y$, $C_xF_y$, $SF_6$, or $NF_3$ gas as an etchant, an etch rate of the etch stop layer 130 is slower than that of at least one of the ILD layer 230. Since the etch stop layer 130 is protected by the protective layer 140 during previous etching process (e.g., the etching process to the ILD layer 220 and the dielectric layer 150), the thickness of the etch stop layer 130 is maintained, and therefore the etching the via openings O2 may stop at the etch stop layer 130 and not damage the underlying ILD layer 122. Subsequently, a liner removal process is performed to remove a portion of the etch stop layer 130 exposed by the via openings O2, thereby deepening the via openings O2. For example, the liner removal process may include a dry etch process using a suitable gas etchant (e.g., fluoride-based gas) to remove the portion of the etch stop layer 130. Through the operations, the via openings O2 are etched through the ILD layer 230 and the etch stop layer 130, and exposes the metallization pattern 124.

After the trench openings T1 and T2 and the via opening O2 are filled with metals, a planarization is performed to remove an excess portion of the metals outside the trench openings T1 and T2, and therefore the metallization pattern 240 is formed. For example, the metallization pattern 240 includes metal lines M11 and M12 respectively in the trench openings T1 and T2 and a conductive via V0 in the via opening O2. Through the configuration, the metallization pattern 240 can reach and electrically connect the metallization pattern 124.

In some embodiments of the present disclosure, a top surface of the first portion 132 of the etch stop layer 130 is in contact with the protective layer 140, and a top surface of the second portion 134 of the etch stop layer 130 is in contact with the ILD layer 230. The protective layer 140 is in the memory region CR and not in the logic region LR. The protective layer 140 can be detected by material detection technology or material analysis technology. For example, energy dispersive X-ray (EDX) spectroscopy, Auger electron spectroscopy (AES), secondary-ion mass spectrometry (SIMS), or other suitable techniques may be adopted for detecting the aluminum in the device, and thereby ensuring the existence of the protective layer 140.

Figure 14:
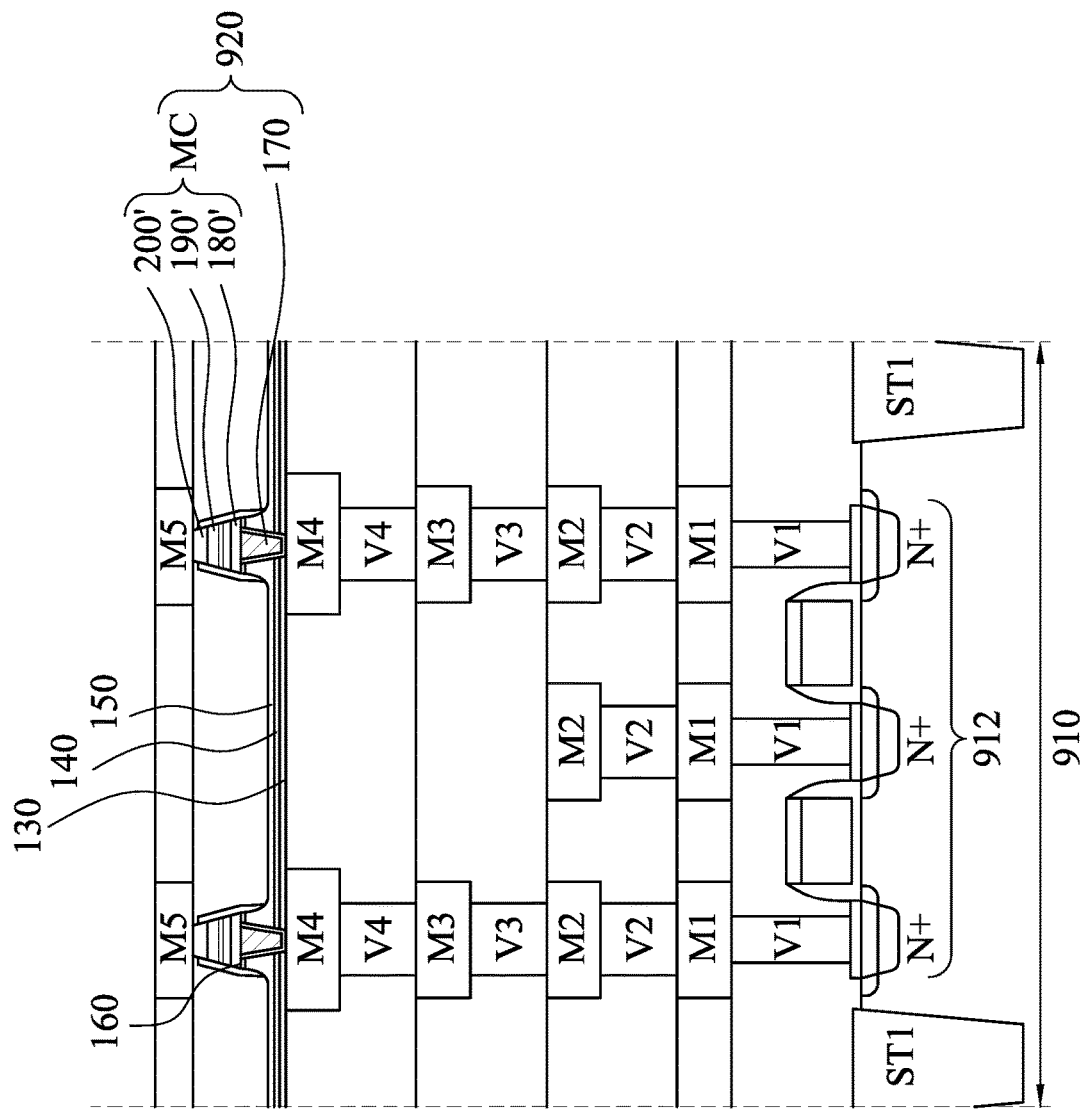
FIG. 14 illustrates a cross-sectional view of an integrated circuit according to some embodiments of the present disclosure.

FIG. 14 illustrates an integrated circuit including MRAM devices and logic devices. The integrated circuit includes a logic region 900 and a MRAM region 910. Logic region 900 may include circuitry, such as the exemplary transistor 902, for processing information received from MRAM devices 920 in the MRAM region 910 and for controlling reading and writing functions of MRAM devices 920. In some embodiments, the MRAM device 920 includes a memory stack MC and a BEVA 170 under the memory stack MC. The BEVA 170 is located in a etch stop layer 130, a protective layer 140, a dielectric layer 150, and a polish stop layer 160. The etch stop layer 130 extends across the logic region 900 and the MRAM region 910. The protective layer 140, the dielectric layer 150, and the polish stop layer 160 are in the MRAM region 910 and not in the logic region 900. The memory stack MC may include a resistance switching element 190', a top electrode 200' over the resistance switching element 190', and a bottom electrode 180' under the resistance switching element 190'.

As depicted, the integrated circuit is fabricated using five metallization layers, labeled as M1 through M5, with five layers of metallization vias or interconnects, labeled as V1 through V5. Other embodiments may contain more or fewer metallization layers and a corresponding more or fewer number of vias. Logic region 900 includes a full metallization stack, including a portion of each of metallization layers M1-M5 connected by interconnects V2-V5, with V1 connecting the stack to a source/drain contact of logic transistor 902. The MRAM region 910 includes a full metallization stack connecting MRAM devices 920 to transistors 912 in the MRAM region 910, and a partial metallization stack connecting a source line to transistors 912 in the MRAM region 910. MRAM devices 920 are depicted as being fabricated in between the top of the M4 layer and the bottom the M5 layer. In some embodiments, MRAM devices 920 may be with the same height of M5+V5, and thus the M5 layer is absent from the MRAM region 910. Also included in integrated circuit is a plurality of ILD layers. Six ILD layers, identified as ILD0 through ILD5 are depicted in FIG. 14 as spanning the logic region 900 and the MRAM region 910. The ILD layers may provide electrical insulation as well as structural support for the various features of the integrated circuit during many fabrication process steps.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that by inserting the protective layer between the etch stop layer and the dielectric layer, the under etch issue due to thickness variation of the dielectric layers is withdrawn, thereby ensuring the connection between the BEVAs and the underlying portion of the metallization pattern. Another advantage is that with the presence of the protective layer, the bottom electrode via opening can be etched in a over etch manner (e.g., for a long etching time) for covering the thickness variations of the layers, which in turn may enlarge the landing window for BEVA. Still advantage is that the etching process in the logic region stops at the protective layer, and the etch stop layer is protected by the protective layer during the etching process.

In some embodiments of the present disclosure, a method for fabricating an integrated circuit is provided. The method includes depositing an etch stop layer over an interconnect layer having a conductive feature; depositing a protective layer over the etch stop layer; depositing a first dielectric layer over the protective layer; etching a via opening in the first dielectric layer, wherein the protective layer has a higher etch resistance to etching the via opening than that of the first dielectric layer; etching a portion of the protective layer exposed by the via opening; etching a portion of the etch stop layer exposed by the via opening, such that the via opening exposes the conductive feature; forming a bottom electrode via in the via opening; and forming a memory stack over the bottom electrode via.

In some embodiments of the present disclosure, a method for fabricating an integrated circuit is provided. The method includes depositing a first dielectric layer over a substrate; depositing a second dielectric layer over the first dielectric layer, wherein a carbon atomic concentration of the first dielectric layer is greater than a carbon atomic concentration of the second dielectric layer; forming a bottom electrode via penetrating through the first dielectric layer and the second dielectric layer; and forming a memory stack over the bottom electrode via.

In some embodiments of the present disclosure, an integrated circuit includes a interconnect layer, an etch stop layer, a protective layer, a first dielectric layer, a memory stack, and a bottom electrode via. The interconnect layer has a conductive feature. The etch stop layer is over the interconnect layer. The protective layer is over the etch stop layer. The first dielectric layer is over the protective layer. The memory stack is over the first dielectric layer and the memory region. The bottom electrode via is in the first dielectric layer, the etch stop layer, and the protective layer, in which the bottom electrode via connects the memory stack to the conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit, comprising:
   depositing an etch stop layer over an interconnect layer having a conductive feature;
   depositing a protective layer over the etch stop layer;
   depositing a first dielectric layer over the protective layer;
   etching a via opening in the first dielectric layer, the protective layer, and the etch stop layer such that the via opening exposes the conductive feature;
   forming a bottom electrode via in the via opening; and
   forming a memory stack over the bottom electrode via.

2. The method of claim 1, wherein forming the bottom electrode via is performed such that the bottom electrode via has a protruding portion adjoining the protective layer.

3. The method of claim 2, wherein the protruding portion of the bottom electrode via extends beyond a sidewall of the bottom electrode via adjoining the etch stop layer.

4. The method of claim 2, wherein the protruding portion of the bottom electrode via is at least partially over a top surface of the etch stop layer.

5. The method of claim 1, wherein forming the bottom electrode via is performed such that the bottom electrode via has a first sidewall adjoining the first dielectric layer and a second sidewall adjoining the etch stop layer, wherein the second sidewall is slanted with respect to the first sidewall.

6. The method of claim 1, wherein etching the via opening comprises:
   etching a portion of the first dielectric layer, wherein the protective layer has a higher etch resistance to etching the portion of the first dielectric layer than that of the first dielectric layer.

7. The method of claim 1, wherein etching the via opening comprises:
   etching a portion of the protective layer, wherein the etch stop layer has a higher etch resistance to etching the portion of the protective layer than that of the protective layer.

8. The method of claim 1, further comprising:
   depositing a second dielectric layer over the first dielectric layer, wherein etching the via opening is performed such that the via opening is further in the second dielectric layer.

9. The method of claim 8, wherein forming the bottom electrode via comprises:
   overfilling the via opening with a conductive material; and
   performing a polish process on the conductive material until reaching the second dielectric layer, wherein the second dielectric layer have a higher polish resistance to the polish process than that of the first dielectric layer.

10. A method for fabricating an integrated circuit, comprising:
    depositing a first dielectric layer over a substrate;
    depositing a second dielectric layer over the first dielectric layer, wherein a carbon atomic concentration of the first dielectric layer is greater than a carbon atomic concentration of the second dielectric layer, and a thickness of the second dielectric layer is less than a thickness of the first dielectric layer;
    forming a bottom electrode via penetrating through the first dielectric layer and the second dielectric layer; and
    forming a memory stack over the bottom electrode via.

11. The method of claim 10, wherein forming the bottom electrode via comprises:
    etching an opening through the first dielectric layer and the second dielectric layer;
    filling the opening with a conductive material; and
    performing a polish process on the conductive material until reaching the second dielectric layer, wherein the second dielectric layer have a higher polish resistance to the polish process than that of the first dielectric layer.

12. The method of claim 10, wherein a silicon atomic concentration of the second dielectric layer is greater than a silicon atomic concentration of the first dielectric layer.

13. The method of claim 10, wherein forming the memory stack comprises:
    depositing a bottom electrode layer, a resistance switching layer, and a top electrode layer over the second dielectric layer and the bottom electrode via; and
    patterning the top electrode layer, the resistance switching layer, and the bottom electrode layer into the memory stack.

14. The method of claim 13, wherein patterning the top electrode layer, the resistance switching layer, and the bottom electrode layer is performed such that a recess is formed in the first dielectric layer and the second dielectric layer.

15. The method of claim 13, wherein patterning the top electrode layer, the resistance switching layer, and the bottom electrode layer comprises:
    performing an ion-beam etching process.

16. An integrated circuit, comprising:
    an interconnect layer having a conductive feature;
    an etch stop layer over the interconnect layer;
    a protective layer over the etch stop layer;
    a first dielectric layer over the protective layer;
    a memory stack over the first dielectric layer; and
    a bottom electrode via in the first dielectric layer, the etch stop layer, and the protective layer, wherein the bottom electrode via connects the memory stack to the conductive feature, and the bottom electrode via has a straight sidewall in contact with the etch stop layer, the protective layer, and the first dielectric layer.

17. The integrated circuit of claim 16, wherein the protective layer is a metal-containing compound layer.

18. The integrated circuit of claim 16, further comprising:
    a second dielectric layer between the first dielectric layer and the memory stack, wherein the bottom electrode via is further in the second dielectric layer.

19. The integrated circuit of claim 18, wherein a carbon atomic concentration of the first dielectric layer is greater than a carbon atomic concentration of the second dielectric layer.

20. The integrated circuit of claim 18, wherein a silicon atomic concentration of the second dielectric layer is greater than a silicon atomic concentration of the first dielectric layer.

\* \* \* \* \*